(12) United States Patent
Chen

(10) Patent No.: US 10,311,279 B2
(45) Date of Patent: Jun. 4, 2019

(54) FINGERPRINT SENSOR DEVICE AND OPERATION METHOD THEREOF

(71) Applicant: Novatek Microelectronics Corp., Hsinchu (TW)

(72) Inventor: Ji-Ting Chen, Hsinchu County (TW)

(73) Assignee: Novatek Microelectronics Corp., Hsinchu (TW)

( * ) Notice: Subject to any disclaimer, the term of this patent is extended or adjusted under 35 U.S.C. 154(b) by 280 days.

(21) Appl. No.: 15/299,473

(22) Filed: Oct. 21, 2016

(65) Prior Publication Data

US 2018/0114049 A1 Apr. 26, 2018

(51) Int. Cl.
*H01L 21/00* (2006.01)
*G06K 9/00* (2006.01)
*G06F 1/00* (2006.01)

(52) U.S. Cl.
CPC ......... *G06K 9/0012* (2013.01); *G06K 9/0002* (2013.01); *G06F 1/00* (2013.01); *H01L 21/00* (2013.01); *H01L 2221/00* (2013.01)

(58) Field of Classification Search
CPC ....... H01L 21/00; H01L 2221/00; G06F 1/00; G06K 1/00; G06K 2207/00
See application file for complete search history.

(56) References Cited

U.S. PATENT DOCUMENTS

| | | | | |
|---|---|---|---|---|
| 2003/0190061 A1* | 10/2003 | Chou | ................... | G06K 9/0002 382/124 |
| 2004/0096087 A1* | 5/2004 | Funahashi | ............ | G06K 9/0008 382/124 |
| 2013/0127790 A1* | 5/2013 | Wassvik | .................. | G06F 3/042 345/175 |
| 2015/0382446 A1* | 12/2015 | Kwon | .................... | H05K 1/028 174/251 |
| 2016/0026846 A1* | 1/2016 | Lin | ...................... | G06K 9/0002 382/124 |
| 2016/0148034 A1* | 5/2016 | Kremin | ................ | G06K 9/0002 382/124 |

* cited by examiner

Primary Examiner — Jermele M Hollington
Assistant Examiner — Telmilade S Rhodes-Vivour
(74) *Attorney, Agent, or Firm* — JCIPRNET

(57) ABSTRACT

A fingerprint sensor device and an operation method thereof are provided. The fingerprint sensor device includes a driving electrode, a driving circuit, a fingerprint sensing plate, a reading circuit and a determination circuit. The driving circuit applies a driving signal to an object through the driving electrode. The fingerprint sensing plate has sensing electrodes configured to sense the object. The reading circuit reads the driving signal through the fingerprint sensing plate. During a period between a rising edge time point and its adjacent falling edge time point of the driving signal, the reading circuit respectively samples the driving signal in at least two different phases to obtain at least two sampling results and outputs a difference value of the at least two sampling results. The determination circuit checks the difference value to determine whether the object to be sensed is a real finger or a fake finger.

14 Claims, 5 Drawing Sheets

FINGERPRINT SENSOR DEVICE AND OPERATION METHOD THEREOF

BACKGROUND

Field of the Invention

The invention is directed to a biometric characteristic sensing technique and more particularly, to a fingerprint sensor device and an operating method thereof.

Description of Related Art

Finger recognition plays an important role in a biometric recognition system. For the sake of information security, a fingerprint sensor may be disposed in an electronic apparatus (e.g., a handheld mobile telephone). In a fingerprint enrollment stage, the electronic apparatus enrolls a fingerprint according to a fingerprint image captured by the fingerprint sensor, so as to obtain an enrolled fingerprint template. After the fingerprint is enrolled, the electronic apparatus may provide a fingerprint verification function. A similarity degree between a characteristic to be verified and the enrolled characteristic is compared, thereby determining whether they belong the same fingerprint, which is referred to "fingerprint verification". The fingerprint verification can be applied to border control, civil criminal identity, business and home access control, public safety, data storage and retrieval, mobile communication, mobile payment or other information security applications.

The fingerprint recognition technique usually utilizes a capacitive fingerprint sensor. A driving electrode serves to transmit a driving signal to a finger. The driving signal then is transmitted to the capacitive fingerprint sensor through the finger. The capacitive fingerprint sensor reads the driving signal transmitted from the finger, so as to capture a fingerprint of the finger. The implementation detail with respect to the capacitive fingerprint sensor capturing the fingerprint pertains to the well-known technique in the art and thus, will not be repeated. However, when a fraud user attempts to contact the conventional capacitive fingerprint sensor by using a fake finger (e.g., a conductive rubber having a fingerprint characteristic or other means), the conventional capacitive fingerprint sensor is incapable of effectively determining whether the contacting object (i.e., an object to be sensed) is a real finger or a fake finger.

SUMMARY

The invention provides a fingerprint sensor device and an operation method thereof capable of effectively recognizing an object to be sensed is a real finger or a fake finger.

According to an embodiment of the invention, a fingerprint sensor device is provided. The fingerprint sensor device includes a driving electrode, a driving circuit, a fingerprint sensing plate, a reading circuit and a determination circuit. The driving circuit is coupled to the driving electrode. The driving circuit is configured to apply a driving signal to an object to be sensed through the driving electrode. The fingerprint sensing plate has a plurality of sensing electrodes. The sensing electrodes are configured to sense the object. The reading circuit is coupled to one of the sensing electrodes of the fingerprint sensing plate. The reading circuit is configured to read the driving signal through the fingerprint sensing plate. During a period between a rising edge time point of the driving signal and a falling edge time point of the driving signal adjacent to the rising edge time point, the reading circuit respectively samples the driving signal sensed by the fingerprint sensing plate in at least two different phases to obtain at least two sampling results and outputs a difference value of the at least two sampling results. The determination circuit is coupled to the reading circuit to receive the difference value. The determination circuit is configured to check the difference value to determine whether the object to be sensed is a real finger or a fake finger.

According to an embodiment of the invention, an operation method of a fingerprint sensor device is provided. The fingerprint sensor device includes a driving electrode, a driving circuit, a fingerprint sensing plate, a reading circuit and a determination circuit. The operation method includes: applying a driving signal to an object to be sensed through the driving electrode by the driving circuit; sensing the object by a plurality of sensing electrodes of the fingerprint sensing plate; reading the driving signal through one of the sensing electrodes of the fingerprint sensing plate by the reading circuit, wherein during a period between a rising edge time point of the driving signal and a falling edge time point of the driving signal adjacent to the rising edge time point, the reading circuit respectively samples the driving signal sensed by the fingerprint sensing plate in at least two different phases to obtain at least two sampling results and outputs a difference value of the at least two sampling results; and checking the difference value to determine whether the object to be sensed is a real finger or a fake finger by the determination circuit.

To sum up, in the fingerprint sensor device and the operation method thereof provided by the embodiments of the invention, the driving signal sensed by the fingerprint sensing plate are respectively sampled in different phases to obtain a plurality of sampling results. The determination circuit checks the difference relation between the sampling results to determine whether the object to be sensed is a real finger or a fake finger. Thus, the fingerprint sensor device and the operation method thereof can effectively recognize whether the object to be sensed is a real finger or a fake finger.

To make the above features and advantages of the invention more comprehensible, embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
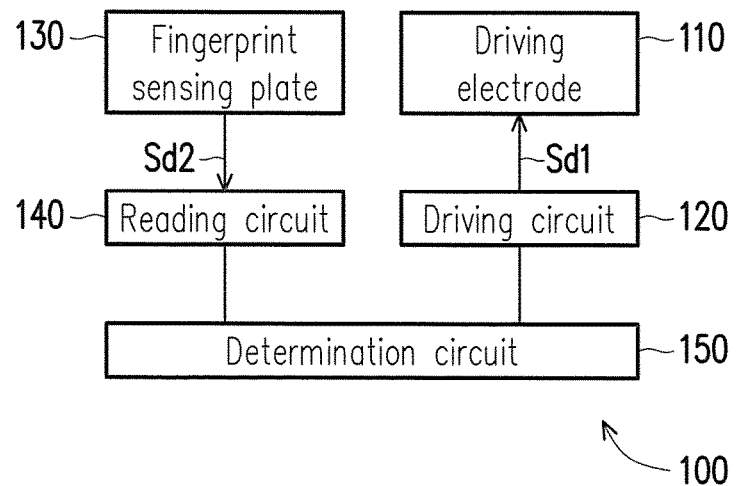
FIG. 1 is a schematic circuit block diagram illustrating a fingerprint sensor device according to an embodiment of the invention.

The term "couple (or connect)" herein (including the claims) are used broadly and encompass direct and indirect connection or coupling means. For example, if the disclosure describes a first apparatus being coupled (or connected) to a second apparatus, then it should be interpreted that the first apparatus can be directly connected to the second apparatus, or the first apparatus can be indirectly connected to the second apparatus through other devices or by a certain coupling means. Moreover, elements/components/steps with same reference numerals represent same or similar parts in the drawings and embodiments. Elements/components/notations with the same reference numerals in different embodiments may be referenced to the related description.

Figure 2:
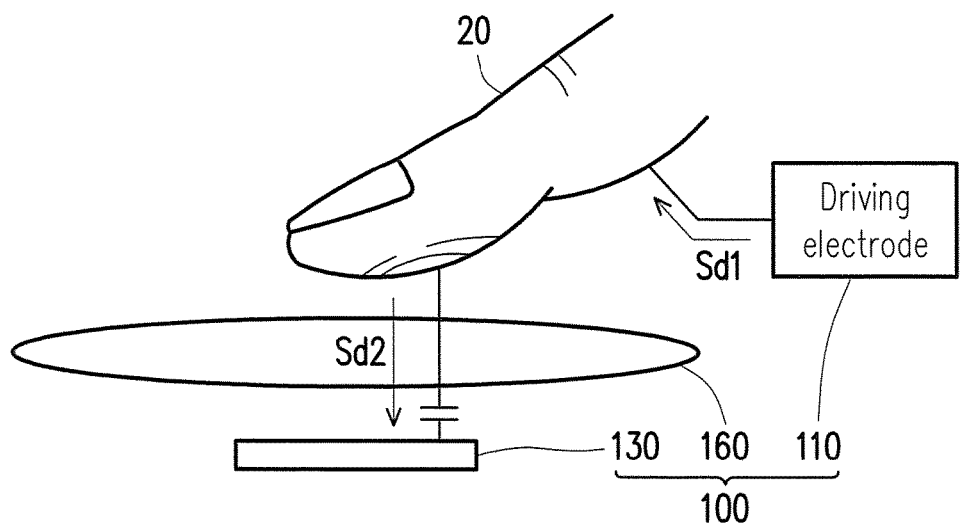
FIG. 2 is a schematic diagram illustrating an application scenario of the fingerprint sensor device depicted in FIG. 1 according to an embodiment of the invention.

FIG. 1 is a schematic circuit block diagram illustrating a fingerprint sensor device 100 according to an embodiment of the invention. The fingerprint sensor device 100 includes a driving electrode 110, a driving circuit 120, a fingerprint sensing plate 130, a reading circuit 140 and a determination circuit 150. FIG. 2 is a schematic diagram illustrating an application scenario of the fingerprint sensor device 100 depicted in FIG. 1 according to an embodiment of the invention. FIG. 2 schematically illustrates a cross-sectional view of the fingerprint sensor device 100.

Referring to FIG. 1 and FIG. 2, the driving circuit 120 is coupled to the driving electrode 110. When an object 20 to be sensed (e.g., a user's finger) contacts the driving electrode 110, the driving circuit 120 applies a driving signal Sd1 to the object 20 to be sensed through the driving electrode 110. A non-conductive substrate 160 is stacked above the fingerprint sensing plate 130. In some embodiments, the non-conductive substrate 160 may be disposed between the driving electrode 110 and the fingerprint sensing plate 130. The non-conductive substrate 160 is, for example, a glass substrate, a plastic substrate, or any other non-conductive substrate. When the object 20 to be sensed approaches the fingerprint sensing plate 130, an equivalent capacitor is formed between the object 20 and the fingerprint sensing plate 130. Thus, a driving signal Sd2 of the object 20 (which is provided by the driving electrode 110) is transmitted to the fingerprint sensing plate 130 through the equivalent capacitor. The fingerprint sensing plate 130 has a plurality of sensing electrodes (not shown). The sensing electrodes are configured to sense the driving signal Sd2 of the object 20. The implementation of the fingerprint sensing plate 130 and the layout of the sensing electrodes (not shown) may be determined based on design requirements, for example, the fingerprint sensing plate 130 illustrated in FIG. 1 may be implemented by using a conventional finger sensing plate.

Figure 3:
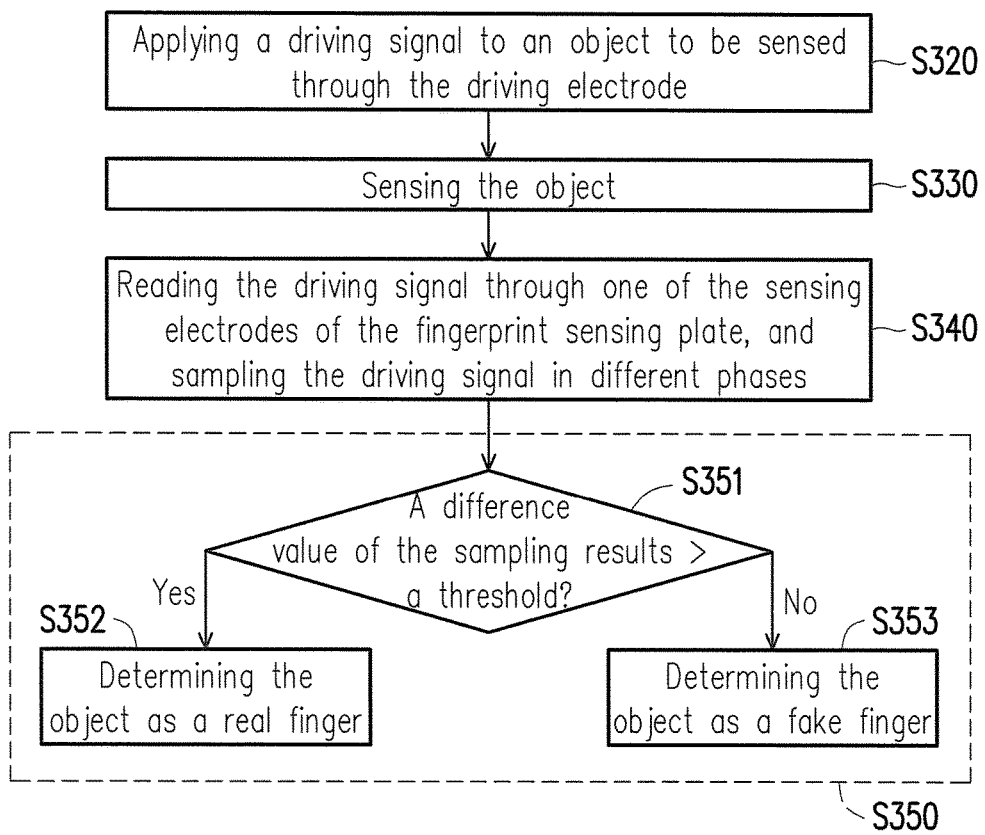
FIG. 3 is a flowchart illustrating an operation method of the fingerprint sensor device according to an embodiment of the invention.

FIG. 3 is a flowchart illustrating an operation method of the fingerprint sensor device according to an embodiment of the invention. Referring to FIG. 1 and FIG. 3, in step S320, the driving circuit 120 applies the driving signal Sd1 to the object 20 to be sensed through the driving electrode 110. In step S330, the plurality of sensing electrodes (not shown) of the fingerprint sensing plate 130 sense the driving signal Sd2 of the object 20, so as to capture a fingerprint of the object 20 to be sensed. The operation of the fingerprint sensing plate 130 capturing the fingerprint may be determined based on design requirements. For example, step S330 illustrated in FIG. 3 may be implemented by utilizing the operation of the conventional capacitive fingerprint sensor capturing the fingerprint.

The reading circuit 140 is coupled to one or more of the sensing electrodes (not shown) of the fingerprint sensing plate 130. In step S340, the reading circuit 140 reads the driving signal Sd2 of the object 20 to be sensed (which is provided by the driving electrode 110) through the fingerprint sensing plate 130. During a period between a rising edge time point of the driving signal Sd1 and a falling edge time point of the driving signal Sd1 adjacent to the rising edge time point, the reading circuit 140 respectively samples the driving signal Sd2 sensed by the fingerprint sensing plate 130 in at least two different phases to obtain at least two sampling results and outputs a difference value of the at least two sampling results to the determination circuit 150 (step S340).

Figure 4:
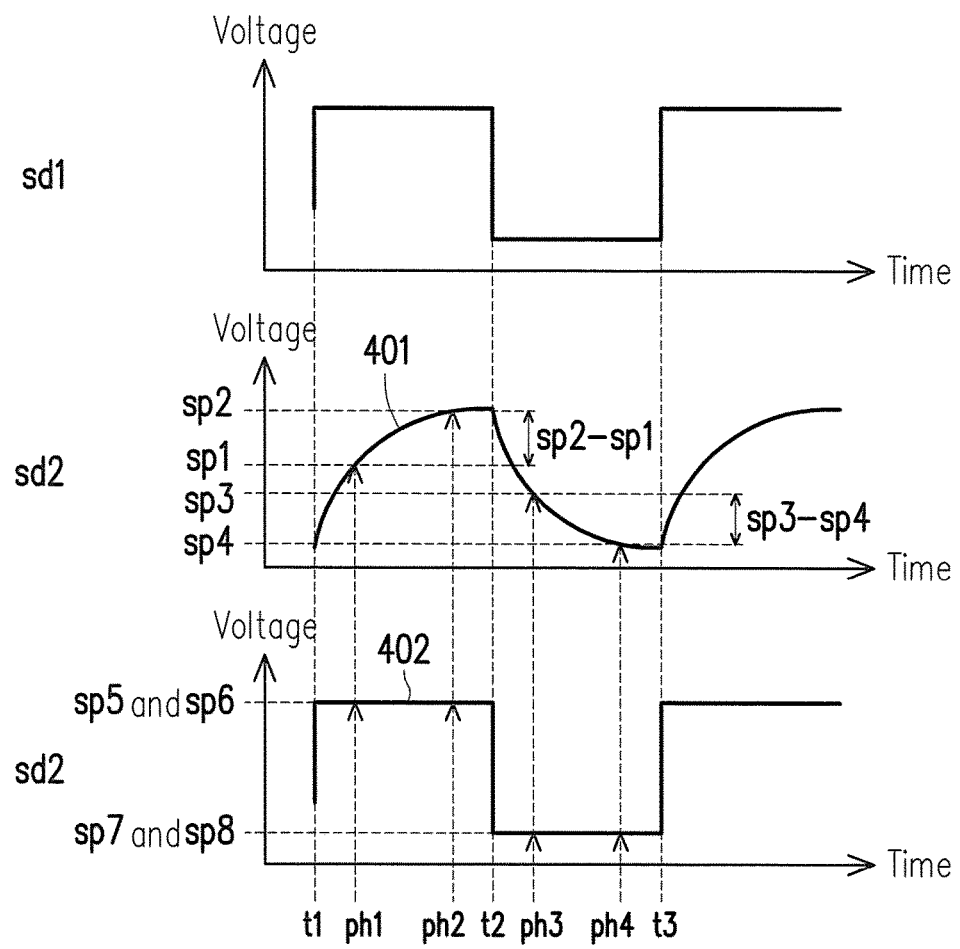
FIG. 4 is a schematic diagram illustrating signal waveforms and a timing sequence of the fingerprint sensor device depicted in FIG. 1 according to an embodiment of the invention.

FIG. 4 is a schematic diagram illustrating signal waveforms and a timing sequence of the fingerprint sensor device 100 depicted in FIG. 1 according to an embodiment of the invention. The lateral axis illustrated in FIG. 4 represent the time, while the longitudinal axis represents voltages. In the implementation example illustrated in FIG. 4, the driving circuit 120 outputs a square-wave clock signal to the driving electrode 110 to serve as the driving signal Sd1. Generally speaking, a user's finger (a real finger) has a higher resistance, but a fake finger (e.g., a conductive rubber having a fingerprint characteristic or other means) has a lower resistance. If the object 20 to be sensed is a real finger, a waveform of the driving signal Sd2 of the object 20 has an obvious resistance and capacitance delay phenomenon (which is presented by, for example, a waveform 401 illustrated in FIG. 4). If the object 20 to be sensed is a fake finger (e.g., a conductive rubber having a fingerprint characteristic), the resistance and capacitance delay phenomenon of the waveform of the driving signal Sd2 of the object 20 is less obvious (which is presented by, for example, a waveform 402 illustrated in FIG. 4).

For example, it is assumed in this case that the object 20 to be sensed is a real finger (with reference to the waveform 401 illustrated in FIG. 4). During a period between a rising edge time point t1 of the driving signal Sd1 and a falling edge time point t2 of the driving signal Sd1 adjacent to the rising edge time point t1, the reading circuit 140 respectively samples the driving signal Sd2 sensed by the fingerprint sensing plate 130 in phases ph1 and ph2 to obtain sampling results sp1 and sp2 and outputs a difference value (sp2-sp1) of the sampling results sp1 and sp2 to the determination circuit 150 (step S340). In some other embodiments, the reading circuit 140 may sample the driving signal Sd2 during a period between the falling edge time point t2 of the driving signal Sd1 and a rising edge time point t3 of the driving signal Sd1 adjacent to the falling edge time point t2. During the period between the falling edge time point t2 and the adjacent rising edge time point t3, the reading circuit 140 may respectively sample the driving signal Sd2 sensed by the fingerprint sensing plate 130 in phases ph3 and ph4 to obtain sampling results sp3 and sp4 and outputs a difference value (sp3-sp4) of the sampling results sp3 and sp4 to the determination circuit 150 (step S340).

It is assumed in this case that the object 20 to be sensed is a fake finger (e.g., a conductive rubber having a fingerprint characteristic). Retelling to the waveform 402 illustrated in FIG. 4, during the period between the rising edge time point t1 of the driving signal Sd1 and the falling edge time point t2 of the driving signal Sd1 adjacent to the rising edge time point t1, the reading circuit 140 respectively samples the driving signal Sd2 sensed by the fingerprint sensing plate 130 in the phases ph1 and ph2 to obtain sampling results sp5 and sp6 and outputs a difference value (sp6-sp5) of the sampling results sp5 and sp6 to the determination circuit 150 (step S340). According to the waveform 402, the difference (sp6-sp5) of the sampling results of the fake finger has a very small vale. In some other embodiments, the reading circuit 140 may sample the driving signal Sd2 during the period between the falling edge time point t2 of the driving signal Sd1 and the rising edge time point t3 of the driving signal Sd1 adjacent to the falling edge time point t2. During the period between the falling edge time point t2 and the adjacent rising edge time point t3, the reading circuit 140 may respectively sample the driving signal Sd2 sensed by the fingerprint sensing plate 130 in the phases ph3 and ph4 to obtain sampling results sp7 and sp8 and outputs a difference value (sp7-sp8) of the sampling results sp7 and sp8 to the determination circuit 150 (step S340). According to the waveform 402, the difference (sp7-sp8) of the sampling results of the fake finger also has a very small vale.

Referring to FIG. 1 and FIG. 3, the determination circuit 150 is coupled to the reading circuit 140, so as to receive the difference value of the sampling results (e.g., the difference value (sp2-sp1) illustrated in FIG. 4.) The determination circuit 150, in step S350, checks the difference value to determine whether the object 20 to be sensed is a real finger or a fake finger. In the embodiment illustrated in FIG. 3, step S350 includes sub-steps S351, S352, and S353.

In step S351, the determination circuit 150 compares the difference value of the sampling results with a threshold and determines whether the object 20 to be sensed is a real finger or a fake finger according to a comparison result of the difference value and the threshold. When the difference value is greater than the threshold, the determination circuit 150 determines the object 20 to be sensed as a real finger (step S352). When the difference value is less than the threshold, the determination circuit 150 determines the object 20 as a fake finger (step S353).

Figure 5:
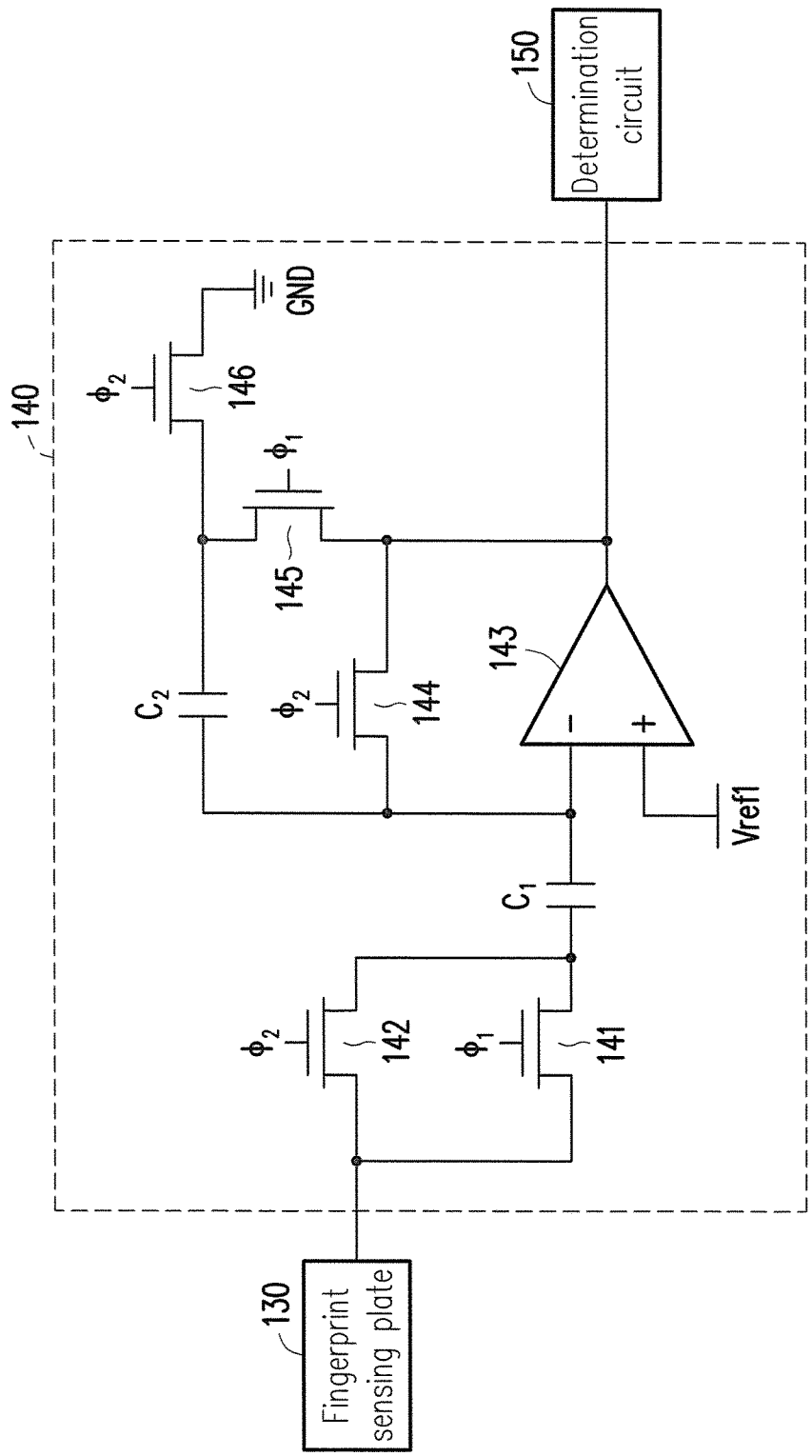
FIG. 5 is a schematic circuit diagram illustrating the reading circuit depicted in FIG. 1 according to an embodiment of the invention.

FIG. 5 is a schematic circuit diagram illustrating the reading circuit 140 depicted in FIG. 1 according to an embodiment of the invention. The reading circuit 140 includes a first sampling switch 141, a second sampling switch 142, a sampling capacitor $C_1$, an amplifier 143, a reset switch 144, an integrating capacitor $C_2$, an integrating switch 145 and a reference voltage switch 146. A first terminal of the first sampling switch 141 and a first terminal of the second sampling switch 142 are jointly coupled to one of the sensing electrodes (not shown) of the fingerprint sensing plate 130. A first terminal of the sampling capacitor $C_1$ is coupled to a second terminal of the first sampling switch 141 and a second terminal of the second sampling switch 142. An inverting input terminal of the amplifier 143 is coupled to a second terminal of the sampling capacitor $C_1$. A non-inverting input terminal of the amplifier 143 is coupled to a reference voltage Vref1. The implementation of the reference voltage Vref1 may be determined based on design requirements, for example, the reference voltage Vref1 may be a fixed voltage provided by a fixed voltage source or a pulse voltage provided by a clock (pulse) generator. For example, the reference voltage Vref1 may be a ground voltage GND or a fixed voltage with other voltage level. An output terminal of the amplifier 143 is coupled to the determination circuit 150 to provide the difference value of the sampling results. A first terminal and a second terminal of the reset switch 144 are respectively coupled to the inverting input terminal of the amplifier 143 and the output terminal of the amplifier 143. A first terminal of the integrating capacitor $C_2$ is coupled to the inverting input terminal of the amplifier 143. A first terminal and a second terminal of the integrating switch 145 are respectively coupled to a second terminal of the integrating capacitor $C_2$ and the output terminal of the amplifier 143. A first terminal and a second terminal of the reference voltage switch 146 are respectively coupled to the second terminal of the integrating capacitor $C_2$ and the reference voltage (e.g., the ground voltage GND). Control terminals of the first sampling switch 141 and the integrating switch 145 are controlled by a first clock signal $\phi 1$. Control terminals of the second sampling switch 142, the reset switch 144 and the reference voltage switch 146 are controlled by a second clock signal $\phi 2$. A pulse of the first clock signal $\phi 1$ does not overlap a pulse of the second clock signal $\phi 2$.

Figure 6:
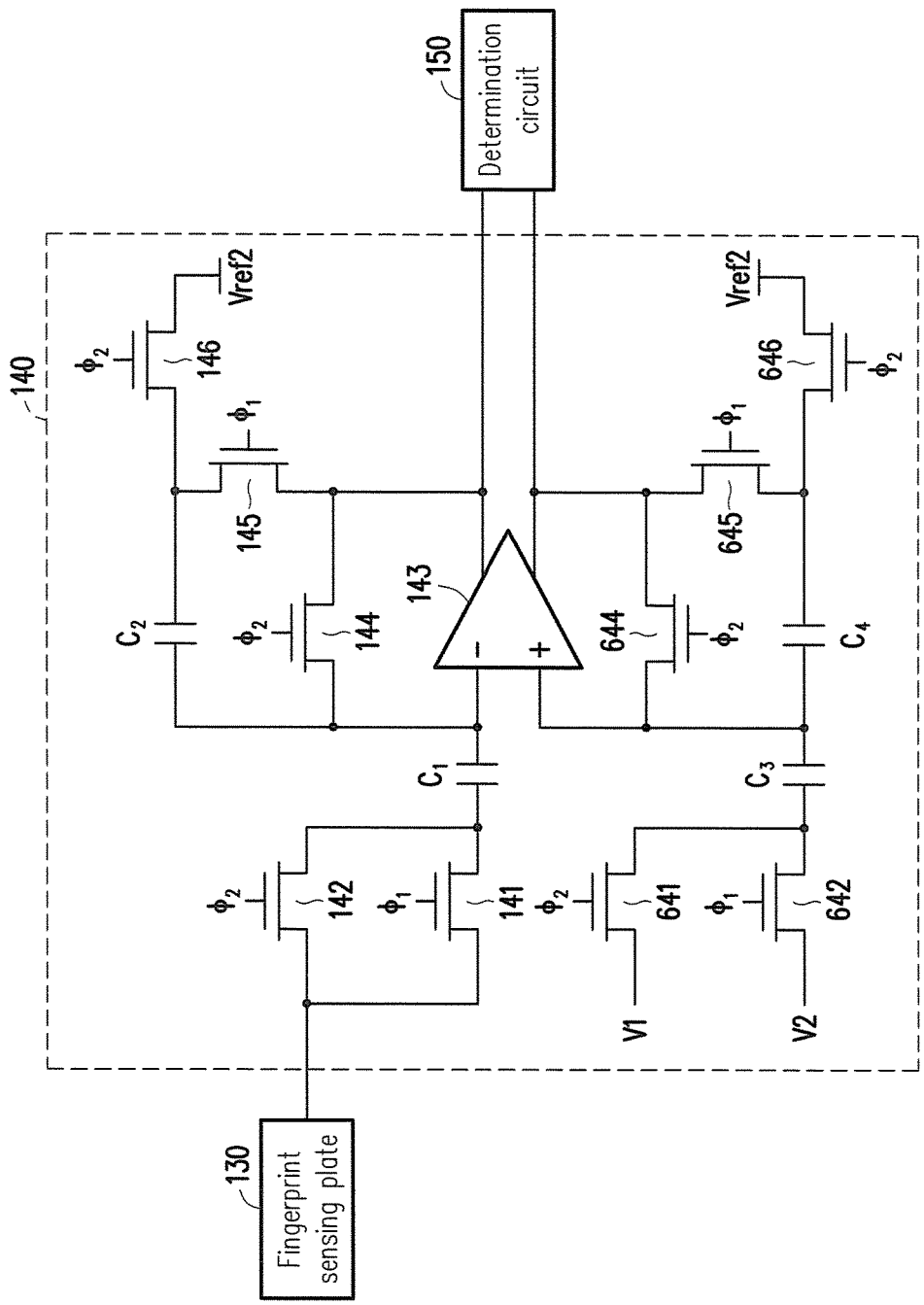
FIG. 6 is a schematic circuit diagram illustrating the reading circuit depicted in FIG. 1 according to another embodiment of the invention.

FIG. 6 is a schematic circuit diagram illustrating the reading circuit 140 depicted in FIG. 1 according to another embodiment of the invention. The reading circuit 140 includes a first sampling switch 141, a second sampling switch 142, a first sampling capacitor $C_1$, an amplifier 143, a first reset switch 144, a first integrating capacitor $C_2$, a first integrating switch 145, a first reference voltage switch 146, a third sampling switch 641, a fourth sampling switch 642, a second sampling capacitor $C_3$, a second reset switch 644, a second integrating capacitor $C_4$, a second integrating switch 645 and a second reference voltage switch 646. A first terminal of the first sampling switch 141 and a first terminal of the second sampling switch 142 are jointly coupled to one of the sensing electrodes (not shown) of the fingerprint sensing plate 130. A first terminal of the first sampling capacitor $C_1$ is coupled to a second terminal of the first sampling switch 141 and a second terminal of the second sampling switch 142. An inverting input terminal of the amplifier 143 is coupled to a second terminal of the first sampling capacitor $C_1$. The differential output terminals of the amplifier 143 are coupled to the determination circuit 150 to provide the difference value of the sampling results. A first terminal and a second terminal of the first reset switch 144 are respectively coupled to the inverting input terminal of the amplifier 143 and a first output terminal of the differential output terminals of the amplifier 143. A first terminal of the first integrating capacitor $C_2$ is coupled to the inverting input terminal of the amplifier 143. A first terminal and a second terminal of the first integrating switch 145 are respectively coupled to a second terminal of the first integrating capacitor $C_2$ and the first output terminal of the differential output terminals of the amplifier 143. A first terminal and a second terminal of the first reference voltage switch 146 are respectively coupled to the second terminal of the first integrating capacitor $C_2$ and a reference voltage Vref2. The implementation of the reference voltage Vref2 may be determined based on design requirements, for example, the reference voltage Vref2 may be provided by a fixed voltage source. For example, the reference voltage Vref2 may be a ground voltage GND or a fixed voltage with other voltage level.

A first terminal of the third sampling switch 641 is coupled to a voltage V1. A first terminal of the fourth sampling switch 642 is coupled to a voltage V2. The implementation of the voltage V1 and the voltage V2 may be determined based on design requirements, for example, the voltage V1 may be a fixed voltage provided by a fixed voltage source, and the voltage V2 may be a fixed voltage provided by another fixed voltage source. For example, the voltage V1 and the voltage V2 are two fixed voltages between the system voltage Vcc and the ground voltage GND. A first terminal of the second sampling capacitor $C_3$ is coupled to a second terminal of the third sampling switch 641 and a second terminal of the fourth sampling switch 642. A non-inverting input terminal of the amplifier 143 is coupled to a second terminal of the second sampling capacitor $C_3$. A first terminal and a second terminal of the second reset switch 644 are respectively coupled to the non-inverting input terminal of the amplifier 143 and a second output terminal of the differential output terminals of the amplifier 143. A first terminal of the second integrating capacitor $C_4$ is coupled to the non-inverting input terminal of the amplifier 143. A first terminal and a second terminal of the second integrating switch 645 are respectively coupled to a second terminal of the second integrating capacitor $C_4$ and the second output terminal of the differential output terminals of the amplifier 143. A first terminal and a second terminal of the second reference voltage switch 646 are respectively coupled to the second terminal of the second integrating capacitor $C_4$ and the reference voltage Vref2.

Control terminals of the first sampling switch 141, the first integrating switch 145, the fourth sampling switch 642 and the second integrating switch 645 are controlled by a first clock signal ϕ1. Control terminals of the second sampling switch 142, the first reset switch 144, the first reference voltage switch 146, the third sampling switch 641, the second reset switch 644 and the second reference voltage switch 646 are controlled by a second clock signal ϕ2. A pulse of the first clock signal ϕ1 does not overlap a pulse of the second clock signal ϕ2.

It should be noted that in different application scenarios, related functions of the reading circuit 140 and/or the determination circuit 150 may be implemented in form of software, firmware or hardware by utilizing general programming languages (e.g., C or C++), hardware description languages (e.g., Verilog HDL or VHDL) or other suitable programming languages. The software (or firmware) capable of executing the related functions may be deployed in any known computer-accessible media, such as magnetic tapes, semiconductor memories, magnetic discs or compact discs (e.g., CD-ROMs or DVD-ROMs) or may be transmitted through Internet, wired communication means, wireless communication means, or other communication media. The software (or firmware) may be stored in an accessible medium of a computer, such that a processor of the computer may access/execute programming codes of the software (or firmware). Moreover, the device and the method of the invention may be implemented by a combination of hardware and software.

Based on the above, in the fingerprint sensor device and the operation method thereof provided by the embodiments of the invention, the driving signal sensed by the fingerprint sensing plate are respectively sampled in different phases to obtain a plurality of sampling results. The determination circuit can check the difference relation between the sampling results to determine whether the object to be sensed is a real finger or a fake finger. Thus, the fingerprint sensor device and the operation method thereof can effectively recognize whether the object to be sensed is a real finger or a fake finger.

Although the invention has been disclosed by the above embodiments, they are not intended to limit the invention. It will be apparent to one of ordinary skill in the art that modifications and variations to the invention may be made without departing from the spirit and scope of the invention. Therefore, the scope of the invention will be defined by the appended claims.

What is claimed is:

1. A fingerprint sensor device, comprising:
   a driving electrode;
   a driving circuit, coupled to the driving electrode and configured to apply a driving signal to an object to be sensed through the driving electrode;
   a fingerprint sensing plate, having a plurality of sensing electrodes, wherein the sensing electrodes are configured to sense the object;
   a reading circuit, coupled to one of the sensing electrodes of the fingerprint sensing plate and configured to read the driving signal through the fingerprint sensing plate, wherein during a period between a rising edge time point of the driving signal and a falling edge time point of the driving signal adjacent to the rising edge time point, the reading circuit respectively samples the driving signal sensed by the fingerprint sensing plate in at least two different phases to obtain at least two sampling results, and outputs a difference value of the at least two sampling results; and
   a determination circuit, coupled to the reading circuit to receive the difference value and configured to check the difference value to determine whether the object to be sensed is a real finger or a fake finger.

2. The fingerprint sensor device according to claim 1, further comprising:
   a non-conductive substrate, stacked on the fingerprint sensing plate and disposed between the driving electrode and the fingerprint sensing plate.

3. The fingerprint sensor device according to claim 1, wherein the driving circuit outputs a square wave to the driving electrode to serve as the driving signal.

4. The fingerprint sensor device according to claim 1, wherein the reading circuit comprises:
   a first sampling switch, having a first terminal coupled to one of the sensing electrodes;
   a second sampling switch, having a first terminal coupled to the one of the sensing electrodes;
   a sampling capacitor, having a first terminal coupled to a second terminal of the first sampling switch and a second terminal of the second sampling switch;
   an amplifier, having an inverting input terminal coupled to a second terminal of the sampling capacitor, a non-inverting input terminal coupled to a reference voltage and an output terminal coupled to the determination circuit to provide the difference value;
   a reset switch, having a first terminal and a second terminal respectively coupled to the inverting input terminal of the amplifier and the output terminal of the amplifier;
   an integrating capacitor, having a first terminal coupled to the inverting input terminal of the amplifier;
   an integrating switch, having a first terminal and a second terminal respectively coupled to a second terminal of the integrating capacitor and the output terminal of the amplifier; and
   a reference voltage switch, having a first terminal and a second terminal respectively coupled to the second terminal of the integrating capacitor and the reference voltage.

5. The fingerprint sensor device according to claim 4, wherein the first sampling switch and the integrating switch are controlled by a first clock signal, the second sampling switch, the reset switch and the reference voltage switch are controlled by a second clock signal, and a pulse of the first clock signal does not overlap a pulse of the second clock signal.

6. The fingerprint sensor device according to claim 4, wherein the reference voltage is a fixed voltage or a pulse voltage.

7. The fingerprint sensor device according to claim 1, wherein the reading circuit comprises:
   a first sampling switch, having a first terminal coupled to one of the sensing electrodes;
   a second sampling switch, having a first terminal coupled to the one of the sensing electrodes;
   a first sampling capacitor, having a first terminal coupled to a second terminal of the first sampling switch and a second terminal of the second sampling switch;
   an amplifier, having an inverting input terminal coupled to a second terminal of the first sampling capacitor and differential output terminals coupled to the determination circuit to provide the difference value;
   a first reset switch, having a first terminal and a second terminal respectively coupled to the inverting input terminal of the amplifier and a first output terminal of the differential output terminals of the amplifier;
   a first integrating capacitor, having a first terminal coupled to the inverting input terminal of the amplifier;
   a first integrating switch, having a first terminal and a second terminal respectively coupled to a second terminal of the first integrating capacitor and the first output terminal of the differential output terminals of the amplifier;
   a first reference voltage switch, having a first terminal and a second terminal respectively coupled to the second terminal of the first integrating capacitor and a reference voltage;
   a third sampling switch, having a first terminal coupled to a first voltage;
   a fourth sampling switch, having a first terminal coupled to a second voltage;
   a second sampling capacitor, having a first terminal coupled to a second terminal of the third sampling switch and a second terminal of the fourth sampling switch, wherein a second terminal of the second sampling capacitor is coupled to a non-inverting input terminal of the amplifier;
   a second reset switch, having a first terminal and a second terminal respectively coupled to the non-inverting input terminal of the amplifier and a second output terminal of the differential output terminals of the amplifier;
   a second integrating capacitor, having a first terminal coupled to the non-inverting input terminal of the amplifier;
   a second integrating switch, having a first terminal and a second terminal respectively coupled to a second terminal of the second integrating capacitor and the second output terminal of the differential output terminals of the amplifier; and
   a second reference voltage switch, having a first terminal and a second terminal respectively coupled to the second terminal of the second integrating capacitor and the reference voltage.

8. The fingerprint sensor device according to claim 7, wherein the first sampling switch, the first integrating switch, the fourth sampling switch and the second integrating switch are controlled by a first clock signal, the second sampling switch, the first reset switch, the first reference voltage switch, the third sampling switch, the second reset switch and the second reference voltage switch are controlled by a second clock signal, and a pulse of the first clock signal does not overlap a pulse of the second clock signal.

9. The fingerprint sensor device according to claim 1, wherein the determination circuit compares the difference value with a threshold and determines whether the object to be sensed is a real finger or a fake finger according to a comparison result of the difference value and the threshold.

10. The fingerprint sensor device according to claim 9, wherein the determination circuit determines the object to be sensed as a real finger when the difference value is greater than the threshold, and the determination circuit determines the object to be sensed as a fake finger when the difference value is less than the threshold.

11. An operation method of a fingerprint sensor device, wherein the fingerprint sensor device comprises a driving electrode, a driving circuit, a fingerprint sensing plate, a reading circuit and a determination circuit, the operation method comprising:
   applying a driving signal to an object to be sensed through the driving electrode by the driving circuit;
   sensing the object by a plurality of sensing electrodes of the fingerprint sensing plate;
   reading the driving signal through one of the sensing electrodes of the fingerprint sensing plate by the reading circuit, wherein during a period between a rising edge time point of the driving signal and a falling edge time point of the driving signal adjacent to the rising edge time point, the reading circuit respectively samples the driving signal sensed by the fingerprint sensing plate in at least two different phases to obtain at least two sampling results and outputs a difference value of the at least two sampling results; and
   checking the difference value to determine whether the object to be sensed is a real finger or a fake finger by the determination circuit.

12. The operation method according to claim 11, wherein the driving circuit outputs a square wave to the driving electrode to serve as the driving signal.

13. The operation method according to claim 11, wherein the step of checking the difference value comprises:
   comparing the difference value with a threshold and determining whether the object to be sensed is a real finger or a fake finger according to a comparison result of the difference value and the threshold by the determination circuit.

14. The operation method according to claim 13, wherein the step of comparing the difference value with the threshold comprises:
   determining the object to be sensed as a real finger when the difference value is greater than the threshold; and
   determining the object to be sensed as a real finger when the difference value is less than the threshold.

* * * * *